United States Patent
Yokoyama et al.

(10) Patent No.: US 9,088,027 B2
(45) Date of Patent: Jul. 21, 2015

(54) POWER STORAGE MODULE, MANUFACTURING METHOD THEREOF, AND WORKING MACHINE

(71) Applicant: SUMITOMO HEAVY INDUSTRIES, LTD., Tokyo (JP)

(72) Inventors: Kazuya Yokoyama, Yokosuka (JP); Terunobu Nakajyo, Yokosuka (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 118 days.

(21) Appl. No.: 13/764,801

(22) Filed: Feb. 12, 2013

(65) Prior Publication Data
US 2013/0209850 A1  Aug. 15, 2013

(30) Foreign Application Priority Data

Feb. 14, 2012  (JP) ................. 2012-029365
Dec. 6, 2012  (JP) ................. 2012-266841

(51) Int. Cl.
*H01M 2/10* (2006.01)
*H01M 2/06* (2006.01)
*H01M 2/20* (2006.01)
*H01G 11/04* (2013.01)
(Continued)

(52) U.S. Cl.
CPC ............. *H01M 2/1016* (2013.01); *H01G 11/04* (2013.01); *H01G 11/12* (2013.01); *H01G 11/76* (2013.01); *H01G 11/78* (2013.01); *H01G 11/82* (2013.01); *H01M 2/1022* (2013.01); *H01M 2/1072* (2013.01); *H01M 2/1077* (2013.01); *H01M 10/0481* (2013.01); *H05K 13/00* (2013.01); *H01M 2/1083* (2013.01); *H01M 10/052* (2013.01); *H01M 10/5057* (2013.01); *Y02E 60/13* (2013.01); *Y10T 29/49002* (2015.01)

(58) Field of Classification Search
CPC ... H01M 2/10; H01M 2/1077; H01M 2/1083; H01M 2/1016; H01M 2/1022; H01M 2/1072
USPC ............ 429/99, 130, 162, 151, 163; 180/65.1
See application file for complete search history.

(56) References Cited

U.S. PATENT DOCUMENTS 5,487,958 A * 1/1996 Tura ............................. 429/151
7,682,728 B2 * 3/2010 Harper ......................... 429/101
(Continued)

FOREIGN PATENT DOCUMENTS

| CN | 102640347 A | 8/2012 |
| DE | 112010004703 T5 | 11/2012 |
| KR | 10-2012-0088807 | 8/2012 |
| WO | WO 2011/070758 A1 | 6/2011 |

*Primary Examiner* — Kenneth Douyette
(74) *Attorney, Agent, or Firm* — Squire Patton Boggs (US) LLP

(57) ABSTRACT

A plurality of cell units is stacked. A pressurizing mechanism applies a compressive force in a stacked direction to a stacked structure of the cell units. Each of the cell units includes a power storage cell, and a frame body which supports the power storage cell. The frame body includes a positioning portion which restrains a relative position with respect to a direction perpendicular to the stacked direction of the frame bodies adjacent in the stacked direction. The positioning portion positions the frame bodies with respect to the direction perpendicular to the stacked direction. A margin is kept in a direction in which the frame bodies are closer in the stacked direction in a state where the compressive force is applied to the stacked structure due to pressurization through the pressurizing mechanism.

7 Claims, 14 Drawing Sheets

(51) Int. Cl.
*H01G 11/78* (2013.01)
*H05K 13/00* (2006.01)
*H01G 11/12* (2013.01)
*H01G 11/76* (2013.01)
*H01G 11/82* (2013.01)
*H01M 10/04* (2006.01)
*H01M 10/052* (2010.01)
*H01M 10/6556* (2014.01)

(56) References Cited

U.S. PATENT DOCUMENTS

2005/0089751 A1* 4/2005 Oogami et al. ............... 429/162
2012/0234613 A1 9/2012 Miyatake

* cited by examiner

POWER STORAGE MODULE, MANUFACTURING METHOD THEREOF, AND WORKING MACHINE

CROSS-REFERENCE TO RELATED APPLICATIONS

This application is based upon and claims the benefit of priority of the prior Japanese Patent Application No. 2012-029365, filed on Feb. 14, 2012, and the Japanese Patent Application No. 2012-266841, filed on Dec. 6, 2012, the entire contents of which are incorporated herein by reference.

FIELD

The present invention relates to a power storage module in which a plurality of power storage cells are stacked, a manufacturing method thereof, and a working machine on which the power storage module is mounted.

DESCRIPTION OF THE RELATED ART

In the related art, a power storage module is known in which a plurality of laminated power storage cells is stacked and are connected in series. The laminated power storage cells include a structure which seals positive plates and negative plates which are alternately laminated via a separator by interposing two plates between two laminate films. Electrode tabs pass between two laminate films and are led to the outside. After the power storage cells are stacked, the power storage cells are mechanically supported by applying a compressive force to the cells in the stacked direction.

International publication document No.2011/070758 discloses a related art.

SUMMARY

In a laminated power storage cell, since laminate films are flexible, positioning of the power storage cells in a plane perpendicular to a stacked direction at the time of stacking is difficult. Moreover, in a state where the power storage cells are stacked, since the power storage cells themselves spatially interfere with a welding apparatus, it is difficult to connect electric tabs of adjacent power storage cells using ultrasonic welding after the stacking. Therefore, the ultrasonic welding of the electrode tabs may be performed before the stacking. However, it is complicated and increases assembling time to fold and stack the plurality of power storage cells which are connected in series using the ultrasonic welding while positioning the storage cells.

Therefore, it is an object of the present invention to provide a power storage module capable of decreasing the time in which power storage cells are stacked and are assembled to a power storage module. It is another object of the present invention to provide a manufacturing method of the power storage module. It is still another object to provide a working machine which is mounted with the power storage module.

According to an embodiment of the present invention, there is provided a power storage module including: a plurality of cell units which are stacked; and a pressurizing mechanism which applies a compressive force in a stacked direction to a stacked structure of the cell units, wherein each of the cell units includes: a power storage cell; and a frame body which supports the power storage cell, the frame body includes a positioning portion which restrains a relative position with respect to a direction perpendicular to the stacked direction of the frame bodies adjacent in the stacked direction, and the positioning portion includes a structure which positions the frame bodies with respect to the direction perpendicular to the stacked direction and leaves a margin in a direction in which the frame bodies are closer in the stacked direction in a state where the compressive force is applied to the lamination structure due to pressurization through the pressurizing mechanism.

According to another embodiment of the present invention, there is provided a manufacturing method of a power storage module, including: stacking a plurality of cell units which include a power storage cell, a frame body which supports the power storage cell, and a heat transfer plate which is fixed to the frame body; arranging the positions of the cell units with respect to a direction perpendicular to a stacked direction of the cell unit so that the end surfaces of the heat transfer plates are arranged on one plane after the cell units are stacked; and screwing electrode tabs of the power storage cells adjacent to each other to the frame body after arranging the positions of the cell units.

According to still another embodiment of the present invention, there is provided a working machine which mounts the power storage module.

Since the frame body supports the power storage cells, the positioning of the power storage cells can be easily performed when the power storage cells are stacked. In addition, since the positioning portion includes a structure in which the frame bodies can displace in the direction in which the frame bodies are closer in the stacked direction, sufficient compressive force can be applied to the power storage cells.

DETAILED DESCRIPTION

[Embodiment 1]

Figure 1A:
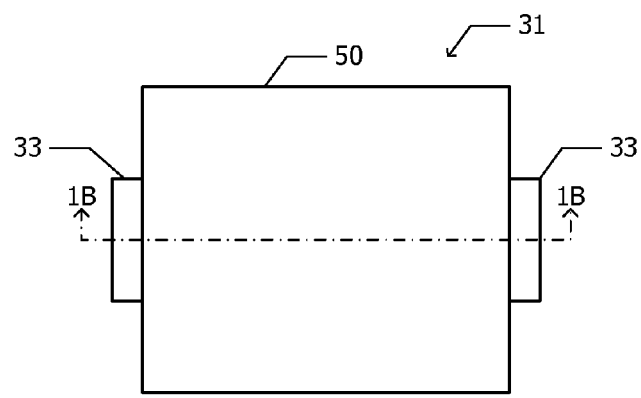
FIG. 1A is a plan view of a power storage cell which is used in a power storage module according to an embodiment 1.

FIG. 1A is a plan view of a laminated power storage cell 31 which is used in a power storage module according to the embodiment 1. For example, an electric double layer capacitor, a lithium ion secondary battery, a lithium ion capacitor, or the like is used for the power storage cell 31. A pair of electrode tabs 33 is led out in the opposite direction from two edges parallel to each other of a power storage container 50 which has a substantially rectangular plane shape.

Figure 1B:
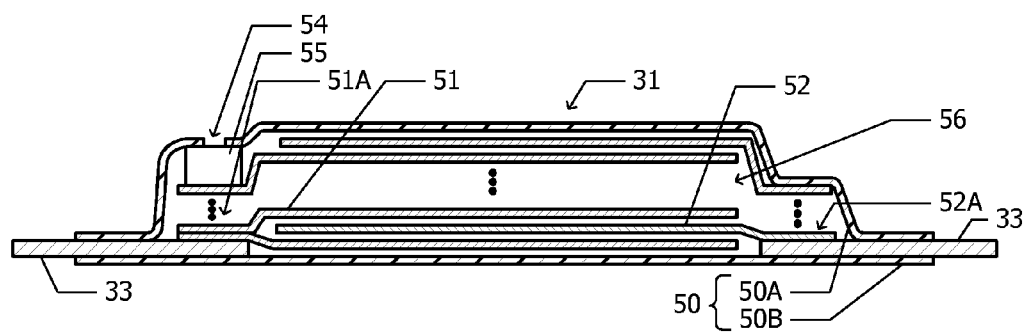
FIG. 1B is a cross-sectional view taken along a one dot chain line 1B-1B of FIG. 1A.

FIG. 1B is a cross-sectional view taken along one dot chain line 1B-1B of FIG. 1A. The power storage container 50 is configured by two laminate films 50A and 50B. For example, aluminum laminate films are used for the laminate films 50A and 50B. The laminate films 50A and 50B sandwich a power storage laminate 56 and seal the power storage laminate 56. One laminate film 50B is substantially flat, and the other laminate film 50A is deformed according to the shape of the power storage laminate 56. The substantially flat surface is referred to as a "back surface", and the deformed surface is referred to a "ventral surface".

Figure 1C:
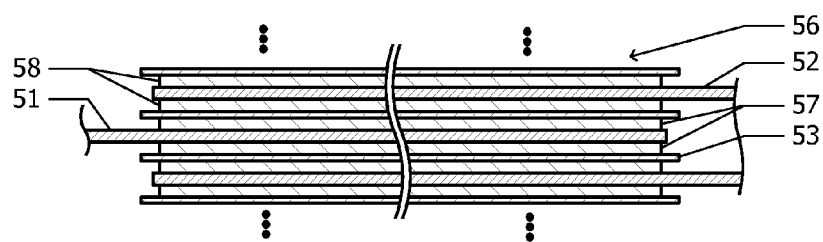
FIG. 1C is a partial cross-sectional view of a power storage laminate.

FIG. 1C shows a partial cross-sectional view of the power storage laminate 56. Polarizable electrodes 57 for a positive electrode are formed on both surfaces of a positive electrode collector 51, and polarizable electrodes 58 for a negative electrode are formed on both surfaces of a negative electrode collector 52. For example, aluminum foils are used for the positive electrode collector 51 and the negative electrode collector 52. For example, the polarizable electrodes 57 for a positive electrode are formed by coating slurry including binders to which active carbon particles are mixed on the surface of the positive electrode collector 51, and thereafter, by heating the surface and fixing the slurry on the surface. The polarizable electrodes 58 for a negative electrode are also formed using the similar method.

The positive electrode collector 51 and the polarizable electrodes 57, which are formed on both surfaces of the positive electrode collector 51, are referred to as a "positive plate", and the negative electrode collector 52 and the polarizable electrodes 58, which are formed on both surfaces of the negative electrode collector 52, are referred to as a "negative plate". The positive plates and the negative plates are alternately laminated. Separators 53 are disposed between the positive plates and the negative plates. For example, cellulose paper is used for the separator 53. Electrolyte is impregnated into the cellulose paper. For example, polarizable organic solvent, such as propylene carbonate, ethylene carbonate, and ethyl methyl carbonate is used as a solvent for the electrolyte. As electrolyte (supporting salt), quarternary ammonium salt such as $SBPB_4$ (spirobipyrrolidinium tetrafluoroborate) is used. The separator 53 prevents short-circuit between the polarizable electrode 57 for a positive electrode and the polarizable electrode 58 for a negative electrode, and short-circuit between the positive electrode collector 51 and the negative electrode collector 52.

The description is continued with reference to FIG. 1B again. In FIG. 1B, descriptions with respect to the separator 53 and the polarizable electrodes 57 and 58 are omitted.

The positive electrode collector 51 and the negative electrode collector 52 include connecting portions 51A and 52A which extend in directions (left direction and right direction in FIG. 1A) opposite to each other from the region in which both collectors are overlapped, respectively. The connecting portions 51A of the plurality of positive electrode collectors 51 are superposed and are ultrasonic-welded to one electrode tab 33. The connecting portions 52A of the plurality of negative electrode collectors 52 are superposed and are ultrasonic-welded to the other electrode tab 33. For example, aluminum plates are used for the electrode tabs 33.

The electrode tabs 33 are led up to the outer side of the power storage container 50 through between the laminate film 50A and the laminate film 50B. The laminate film 50A and the laminate film 50B are thermally welded to the electrode tabs 33 in a place where the electrode tabs 33 are led.

A degassing valve 55 is disposed between the connecting portion 51A of the positive electrode collector 51 and the laminate film 50A. The degassing valve 55 is disposed so as to block a degassing hole 54 and is thermally welded to the laminate film 50A. The gas which is generated in the power storage container 50 is discharged outside through the degassing valve 55 and the degassing hole 54.

The inner portion of the power storage container 50 is evacuated. Thereby, the laminate films 50A and 50B are deformed along the outlines of the power storage laminate 56 and the degassing valve 55.

Figure 2:
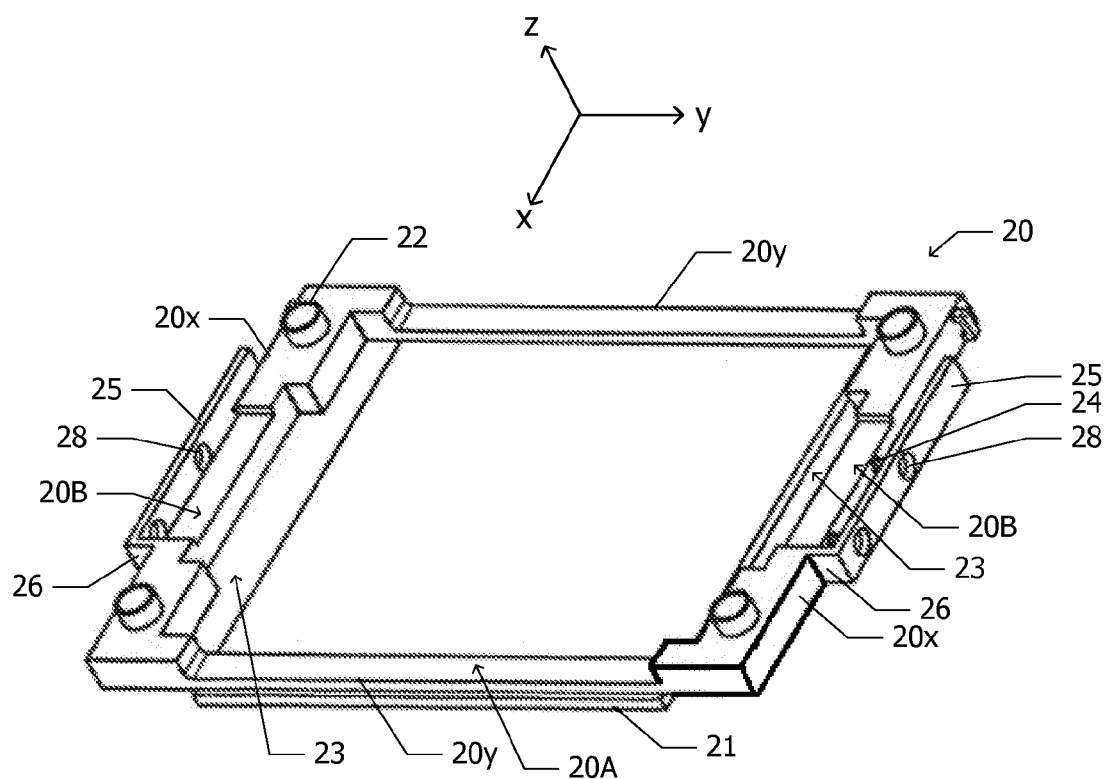
FIG. 2 is a perspective view of a frame body and a heat transfer plate which are used in the power storage module according to the embodiment 1.
Figure 3A:
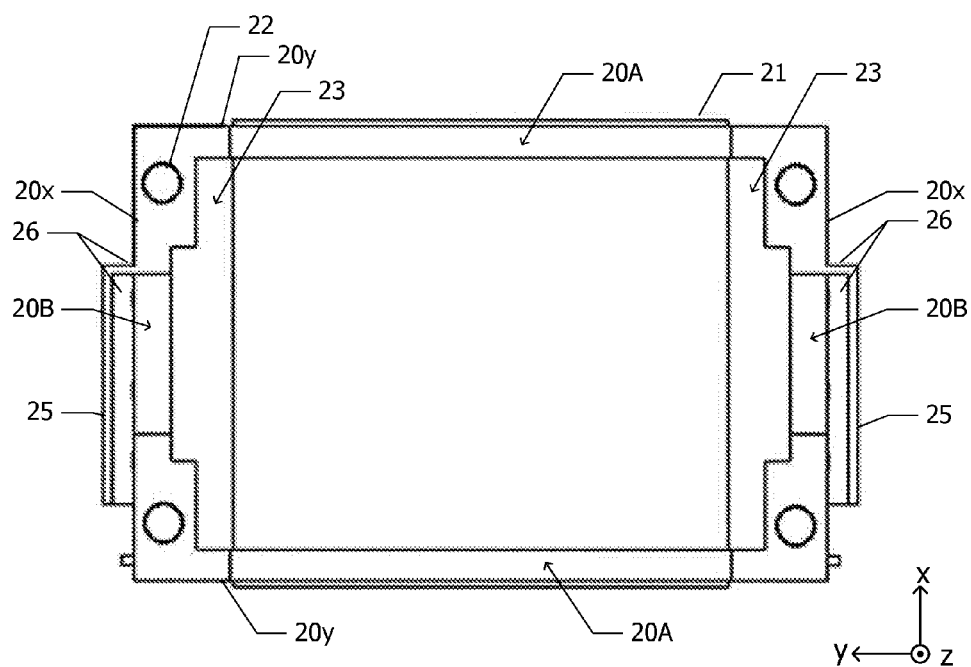
FIG. 3A is a plan view of the frame body and the heat transfer plate which are used in the power storage module according to the embodiment 1 and FIG. 3B is a bottom view of the frame body and the heat transfer plate which are used in the power storage module according to the embodiment 1.
Figure 3B:
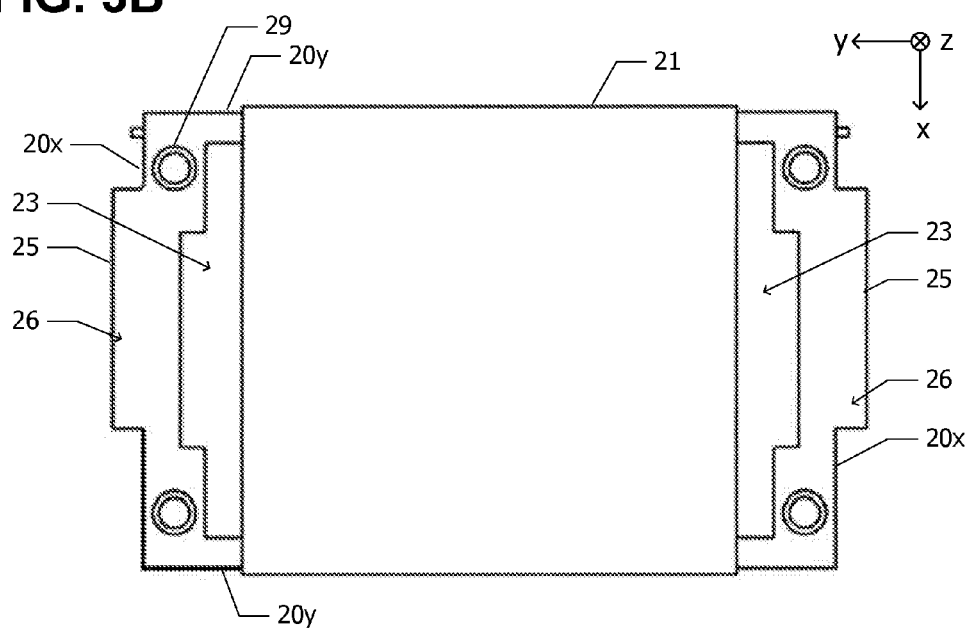

FIG. 2 is a perspective view of a frame body and a heat transfer plate which are used in the power storage module according to the embodiment 1. FIG. 3A is a plan view of the frame body and the heat transfer plate, and FIG. 3B is a bottom view of the frame body and the heat transfer plate. Hereinafter, the structures of the frame body and the heat transfer plate will be described with reference to FIGS. 2, 3A, and 3B.

The laminated power storage cells are accommodated inside the frame body 20 which has a shape along a rectangular outer circumference line. Hereinafter, for convenience of understanding, an xyz rectangular coordinate system is defined. The surface which faces a positive direction of a z axis of the frame body 20 is defined as an upper surface, and the surface which faces a negative direction is defined as a bottom surface. The frame body 20 includes portions 20x (x direction portions) along sides parallel to the x direction of the rectangular and portions 20y (y direction portions) along sides parallel to the y direction. A heat transfer plate 21 is mounted to the bottom surface of the frame body 20. The heat transfer plate 21 includes a rectangular plane shape and is disposed so as to block most of the region enclosed by the frame body 20.

For example, insulating resin such as ABS resin or polybutylene terephthalate (PBT) is used for the frame body 20. For example, a metal having high thermal conductivity such as aluminum is used for the heat transfer plate 21.

Convex portions 22 (FIGS. 2 and 3A) which protrude in the positive direction of the z axis are formed on the upper surface slightly inside the four corners of the frame body 20. Each of the convex portions 22 has a hollow cylindrical shape. Concave portions 29 (FIG. 3B) are formed at positions corresponding to the convex portions 22 of the bottom surface of the frame body 20. When the plurality of frame bodies 20 are stacked in the z direction, the concave portions 22 of the frame bodies 20 on the negative side in the z direction are inserted into the concave portions 29 of the frame bodies 20 on the positive side in the z direction. Thereby, the relative position in the xy plane of the plurality of frame bodies 20 is restrained.

The heat transfer plate 21 is bridged over and spanned between the y direction portions 20y of the frame body 20 and is spaced from the x direction portions 20x. Thereby, openings 23 are formed between the x direction portions 20x of the frame body 20 and the heat transfer plate 21. The heat transfer plate 21 protrudes further outside from the edges of the outer sides of the y direction portions 20y of the frame body 20.

The upper surfaces of the regions 20A, which overlap with the heat transfer plate 21, of the y direction portions 20y of the frame body 20 are lower than other regions. The steps between the lower region 20A and the other regions are larger than the thickness of the heat transfer plate 21. When the plurality of frame bodies 20 is stacked in the z direction, the heat transfer plates 21 are received in the lower regions 20A. Thereby, when the frame bodies 20 are stacked in the z direction, the heat transfer plate 21 does not impede contacts of the upper surface of the frame body 20 on the negative side in the z direction and the bottom surface of the frame body 20 on the positive side in the z direction.

Regions 20B which are a portion of the x direction portions 20x of the frame body 20 are lower than other regions. The electrode tabs 33 (FIG. 1A) is disposed on the lower regions 20B.

A plurality of, for example, three tapped holes 24 (screwing portion) are formed on the surface of the outer circumference side of the x direction portion 20x of the frame body 20. Protective plates 25 are disposed so as to be parallel to surfaces, on which the tapped holes 24 are formed, with an interval from the surfaces. The protective plates 25 are supported to the frame body 20 via support walls 26. The support wall 26 is disposed in a position which does not impede communication between an interval between the surface on which the tapped holes 24 are formed and the protective plate 25 and the space on the lower region 20B.

Through-holes 28 are formed on the protective plates 25. Through-holes 28 are disposed at positions at which virtual columns which are extended from the tapped holes 24 in the y direction and protective plates 25 cross to each other. A screw driver is inserted into the through-hole 28, and screws can be screwed to the tapped holes 24.

The frame body 20, the protective plate 25, and the support wall 26 are integrally molded by resin. For example, the heat transfer plate 21 is screwed to the frame body 20. Alternatively, the heat transfer plate 21 may be anchored to the frame body 20 at the time of molding the frame body 20.

Figure 4:
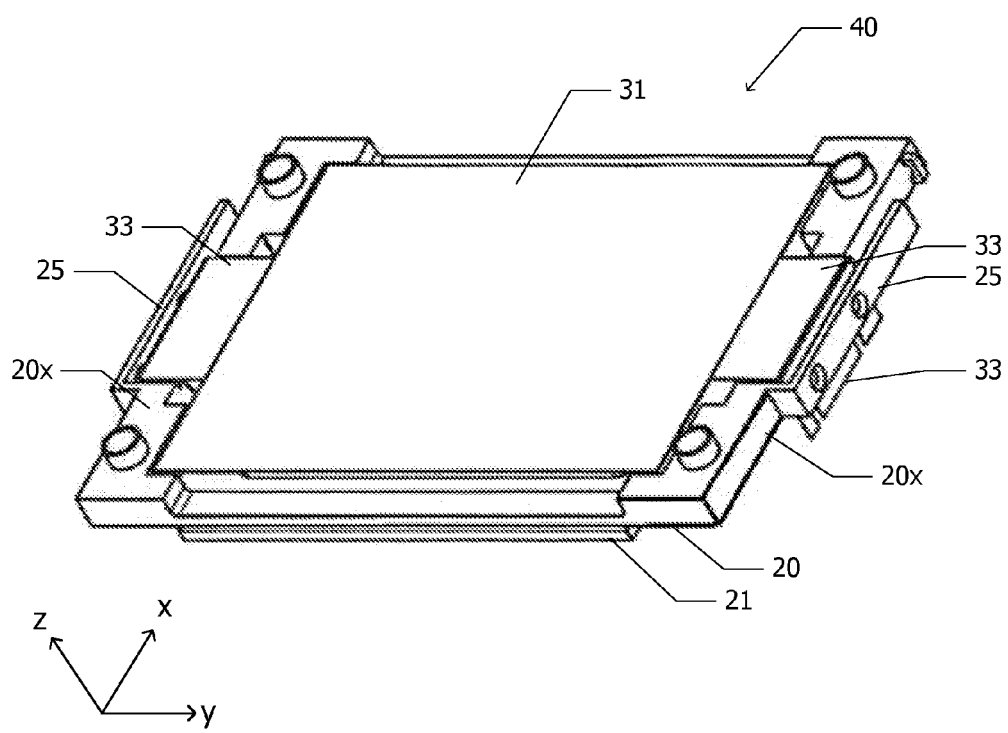
FIG. 4 is a perspective view of a cell unit which is used in the power storage module according to the embodiment 1.
Figure 5A:
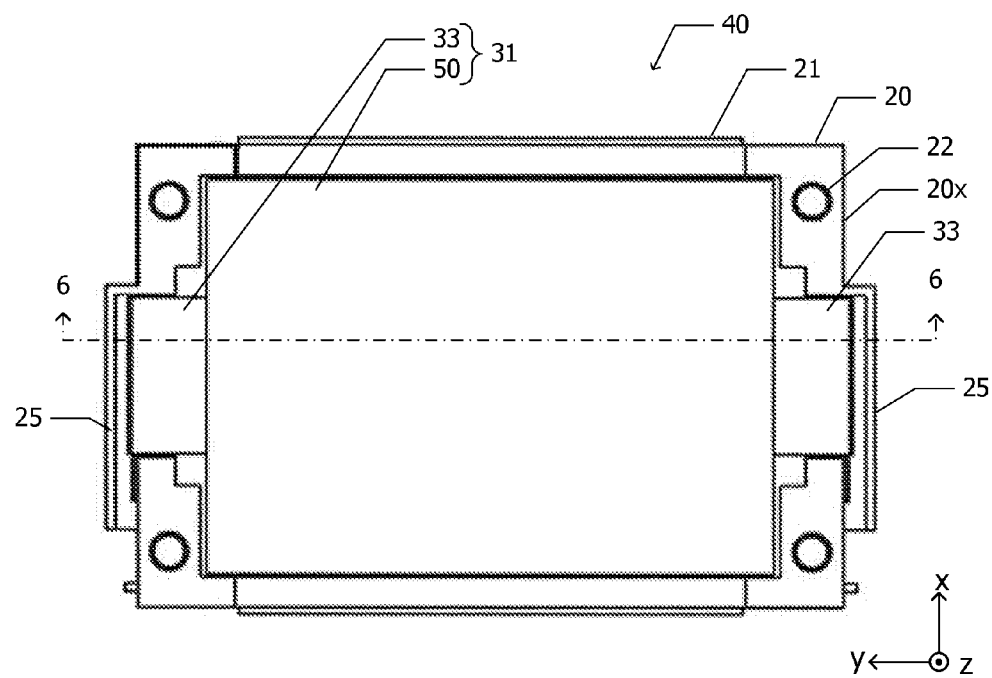
FIG. 5A is a plan view of the cell unit which is used in the power storage module according to the embodiment 1 and FIG. 5B is a bottom view of the cell unit which is used in the power storage module according to the embodiment 1.
Figure 5B:
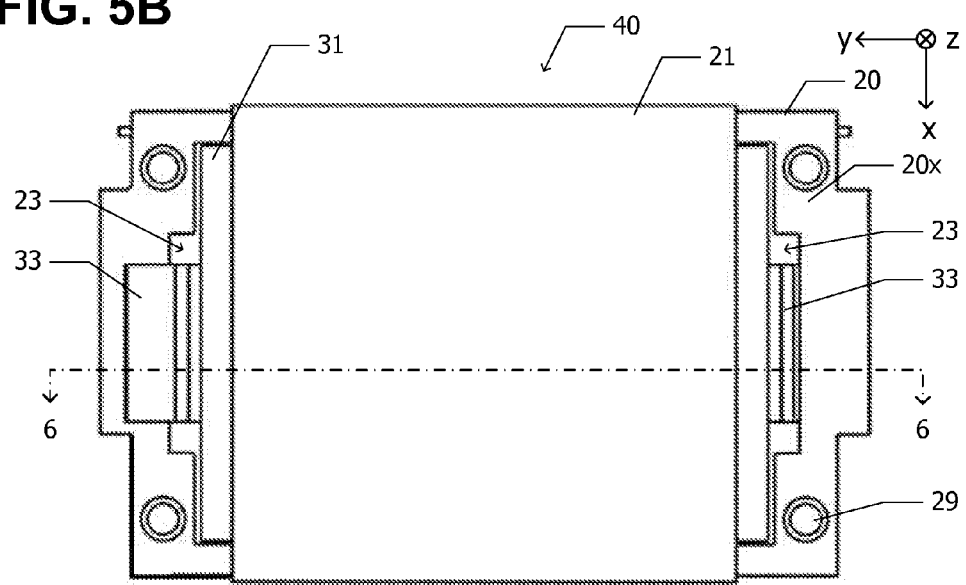
Figure 6:
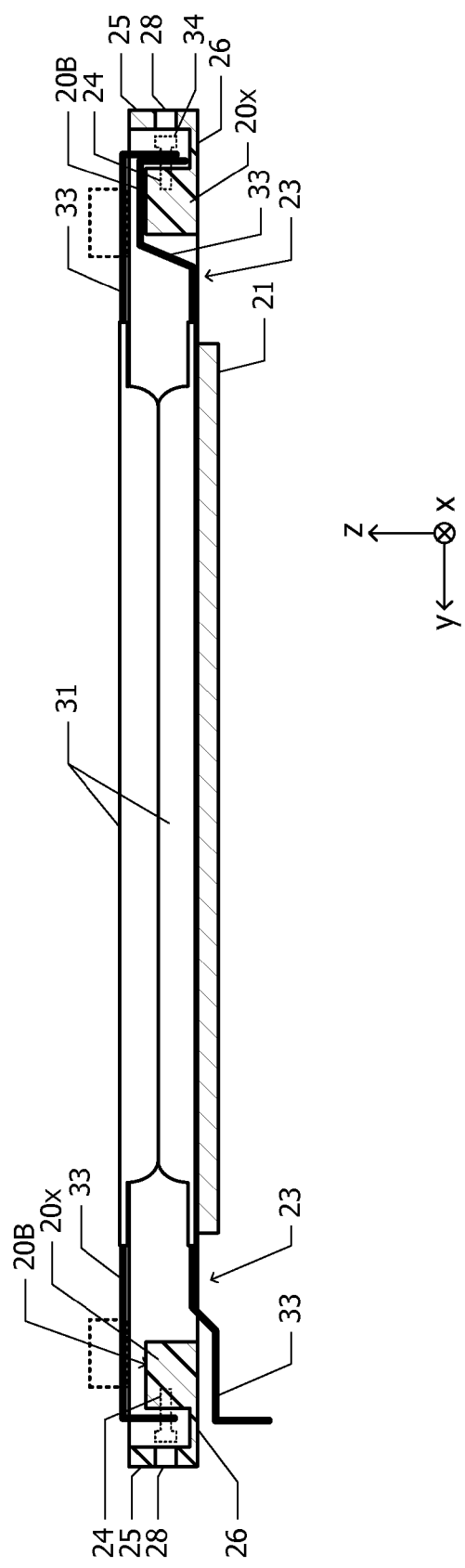
FIG. 6 is a cross-sectional view of the cell unit which is used in the power storage module according to the embodiment 1.

FIG. 4 is a perspective view of a cell unit which configures the power storage module according to the embodiment 1. FIGS. 5A and 5B show a plan view and a bottom view of the cell unit respectively. FIG. 6 is a cross-sectional view taken along one dot chain lines 6-6 of FIGS. 5A and 5B. Hereinafter, the structure of the cell unit will be described with reference to FIGS. 4, 5A, 5B, and 6.

A cell unit 40 includes the frame body 20, the heat transfer plate 21, and two power storage cells 31. As shown in FIG. 6, two power storage cells 31 are stacked so that ventral surfaces thereof face each other, and are disposed on the upper surface side of the heat transfer plate 21. Two power storage cells 31 are supported inside the frame body 20. As shown in FIG. 5A, the frame body 20 surrounds the power storage container 50 of the power storage cells 31 when viewed with a visual line parallel in the z axis.

As shown in FIGS. 5B and 6, one electrode tab 33 of the power storage cell 31 which is disposed on the bottom surface side (heat transfer plate 21 side) of the frame body 20 passes through the opening 23 on the positive side (left side in FIGS. 5B and 6) in the y direction and is led up to the space on the bottom surface side of the frame body 20. The electrode tab 33 on the negative side (right side in FIGS. 5B and 6) in the y direction passes through the space on or above the lower region 20B (FIGS. 2, 3A, and 6) of the x direction portion 20x of the frame body 20 and is inserted into the interval between the x direction portion 20x and the protective plate 25.

As shown in FIGS. 4, 5A, and 6, the pair of electrode tabs 33 of the power storage cell 31 which is disposed on the upper surface side of the frame body 20 passes through the space on or above the lower regions 20B of the x direction portions 20x of the frame body 20 and is inserted into the interval between the x direction portions 20x and the protective plates 25. The electrode tabs 33 on the negative side (right side in FIG. 6) in the y direction of the two power storage cells 31 are overlapped with each other in the interval between the x direction portion 20x and the protective plate 25. The upper surface (back surface) of the power storage cell 31 on the upper surface side protrudes further upward than the upper surface of the frame body 20. That is, total thickness of the two power storage cells 31 is thicker than the thickness from the bottom surface to the upper surface of the frame body 20.

Figure 7:
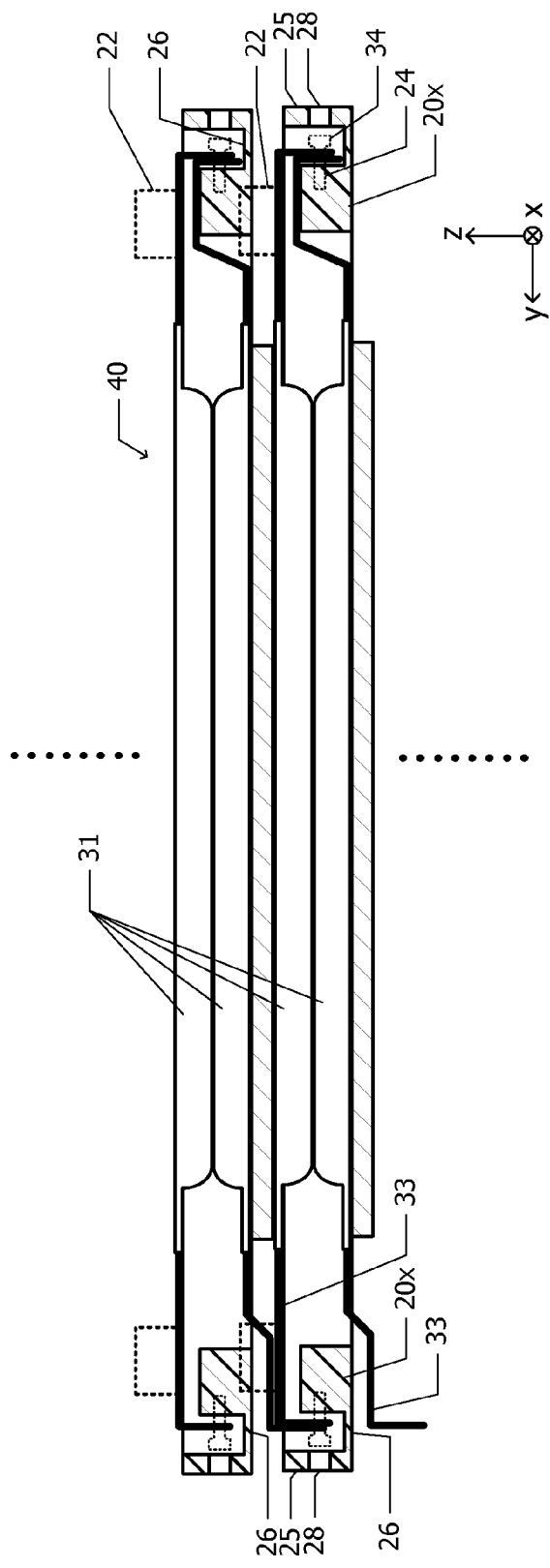
FIG. 7 is a cross-sectional view of a stacked structure in which cell units used in the power storage module according to the embodiment 1 are stacked.

FIG. 7 is a cross-sectional view of a state where the plurality of cell units 40 is stacked. The convex portions 22 of the frame body 20 on the negative side in the z direction are inserted into the concave portions 29 (FIGS. 2B and 5B) of the frame body 20 on the positive side in the z direction. Thereby, the positions in the xy plane of the plurality of cell units 40 are restrained. The convex portions 22 and the concave portions 29 are referred to as a "positioning portion".

The electrode tab 33 on the positive side in the y direction of the power storage cell 31, which is disposed on the bottom surface side of the cell unit 40 on the positive side in the z direction of the two cell units 40 adjacent in the z direction, is inserted into the interval between the x direction portion 20x of the cell unit 40 on the negative side in the z direction and the protective plate 25. Thereby, the electrode tab 33 on the positive side in the y direction of the cell unit 40 on the negative side in the z direction and the electrode tab 33 on the positive side in the y direction of the cell unit 40 on the positive side in the z direction are overlapped with each other in the interval between the x direction portion 20x on the positive side (left side in FIG. 7) in the y direction and the protective plate 25.

The electrode tabs 33 on the negative side in the y direction of the two power storage cells 31 which are included in one cell unit 40 are overlapped with each other in the interval between the x direction portion 20x on the negative side (right side in FIG. 7) in the y direction and the protective plate 25. Holes through which screws pass are formed on the electrode tabs 33. Screws 34 are screwed to the tapped holes 24 through holes which are formed on the electrode tabs 33, and thus, the electrode tabs 33 are electrically connected and can be fixed to the frame body 20. Thereby, the plurality of power storage cells 31 is connected in series. Since the through-holes 28 are formed on the protective plates 25, even in a state where the cell units 40 are stacked, the screws 34 can be tightened from the outside.

The support wall 26, which supports the protective plate 25 on the negative side in the y direction to the frame body 20, has a function which prevents the electrode tab 33 on the negative side in the y direction from contacting the electrode tab 33 on the negative side in the y direction of the cell unit 40 adjacent in the z direction. The support wall 26, which supports the protective plate 25 on the positive side in the y direction, has a function which prevents the electrode tabs 33 on the positive side in the y direction of the two power storage cells 31 in the same cell unit 40 from contacting to each other.

The power storage cell 31 which is disposed on the bottom surface side of the frame body 20 contacts the heat transfer plate 21 of the cell unit 40 which accommodates the power storage cell 31 and is thermally connected to the plate 21. The power storage cell 31 which is disposed on the upper surface side of the frame body 20 contacts the heat transfer plate 21 of the cell unit 40 adjacent to the positive side in the z direction of the cell unit 40 which accommodates the power storage cell 31, and is thermally connected to the plate 21.

Figure 8A:
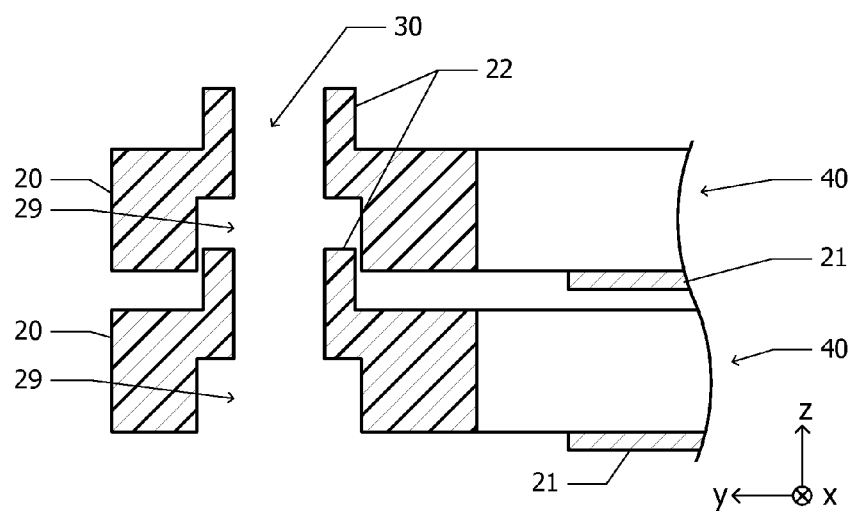
FIG. 8A is a cross-sectional view of a positioning portion of the power storage module according to the embodiment 1 and FIG. 8B is a cross-sectional view of the positioning portion in a state where a compressive force is applied.

FIG. 8A is a cross-sectional view of the positioning portion. The convex portions 22 are formed on the upper surface of each of the frame bodies 20, and the concave portions 29 are formed on the bottom surface. Through-holes 30 are formed from the bottom surfaces of the concave portions 29 to the upper surfaces of the convex portions 22. Thereby, each of the convex portions 22 has a hollow cylindrical shape.

The convex portions 22, which are formed on the cell unit 40 on the negative side in the z direction of two cell units 40 adjacent in the z direction, are inserted into the concave portions 29 which are formed on the cell unit 40 on the positive side in the z direction. As described with reference to FIG. 6, since the total thickness of the two power storage cells 31 is thicker than the thickness from the bottom surface of the frame body 20 to the upper surface, the upper surface of the frame body 20 on the negative side in the z direction and the bottom surface of the frame body 20 on the positive side in the z direction do not contact to each other. An interval is also formed between the tip of the convex portion 22 and the bottom surface of the concave portion 29 into which the convex portion 22 is inserted. Thereby, the positioning portion which is configured by the convex portion 22 and the concave portion 29 restrains the relative position with respect to the xy plane of the stacked cell units 40. However, the positioning portion allows displacement toward the direction in which the cell units are closer to each other in the z direction.

Figure 8B:
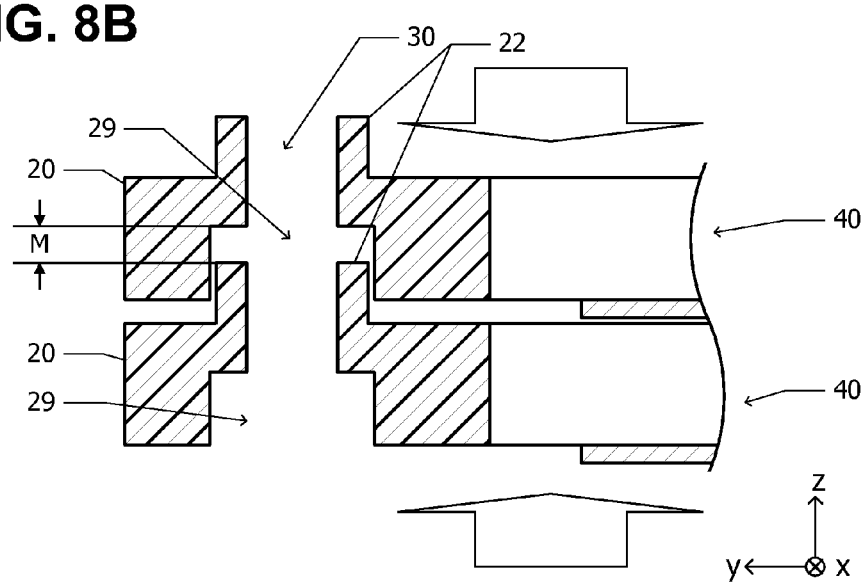

FIG. 8B is a cross-sectional view of the positioning portion when a compressive force is applied in the z direction. Since the positioning portion (convex portion 22 and concave portion 29) allows the displacement toward the direction in which the stacked cell units 40 are closer to each other in the z direction, if the compressive force is applied, each of the power storage cells 31 (FIG. 6) is deformed so as to be thin, and the frame bodies 20 are displaced in the direction closer to each other. Even after the compressive force is applied, the upper surface and the bottom surface of two frame bodies 20 adjacent in the z direction do not contact to each other, and a margin M in the direction in which the frame bodies 20 are closer to each other in the z direction is left.

Since the thicknesses of the power storage cells 31 vary, when the margin M were not left, frame bodies 20 would contact to each other in some regions in a state where the compressive force is applied. If the frame bodies 20 were in contact with each other, the compressive force which is applied by the pressurizing plate 43 is decentralized and applied to the power storage cells 31 and the frame bodies 20. Thereby, the compressive force applied to the power storage cells 31 is decreased.

In the embodiment 1, since the margin M is left, even when the power storage cells 31 vary in thickness, the compressive force can be preferentially applied to each of the power storage cells 31. Thereby, the compressive force is uniformly distributed to all power storage cells 31. The compressive force suppresses a decrease of electrical characteristics of the power storage cells 31 and securely fixes the position of the power storage cells 31.

Figure 9A:
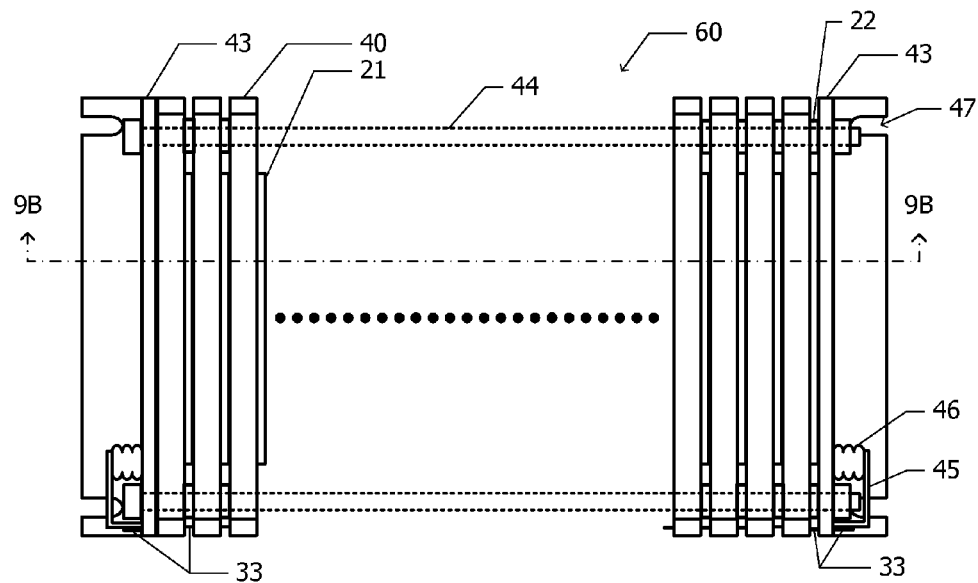
FIG. 9A is a plan view of the power storage module according to the embodiment 1 and FIG. 9B is a cross-sectional view taken along a one dot chain line 9B-9B of FIG. 9A.

FIG. 9A is a plan view of the power storage module 60 according to the embodiment 1. The plurality of cell units 40 is stacked. The compressive force in the stacked direction is applied to the stacked structure of the cell units 40 using a pressurizing mechanism. The pressurizing mechanism includes pressurizing plates 43 which are disposed on both ends of the stacked structure and a plurality of, for example, four tie-rods 44. The tie-rods 44 penetrate one pressurizing plate 43 and reach up to the other pressurizing plate 43. The force in the direction in which two pressurizing plates 43 are close to each other is applied to the two pressurizing plates by tightening bolts to tips of the tie-rods 44. Thereby, the compressive force in the stacked direction is applied to the stacked structure of the cell units 40. The tie-rods 44 pass through the concave portions 29 and the through-holes 30 (FIG. 8A) formed on the frame body 20. When the tip of the convex portion 22 of the frame body 20 disposed on the right end of FIG. 9A contacts the pressurizing plate 43, a spacer may be inserted between the heat transfer plate 21 of the right end and the pressurizing plate 43. The spacer prevents the tip of the convex portion 22 of the frame body 20 disposed on the right end from contacting the pressurizing plate 43.

Relay bus bars 45 are mounted on the outside surfaces of the pressuring plates 43 via insulators 46. The one electrode tab 33 of each of the cell units 40 of both ends is electrically connected to the relay bus bar 45. The relay bus bar 45 serves as a terminal for performing charging and discharging of a series connection circuit of the power storage cells 31.

One edge of the pressuring plate 43 is bent in an L-shape. A U-shaped notch 47 for screwing is formed on the tip portion of the bent place.

Figure 9B:
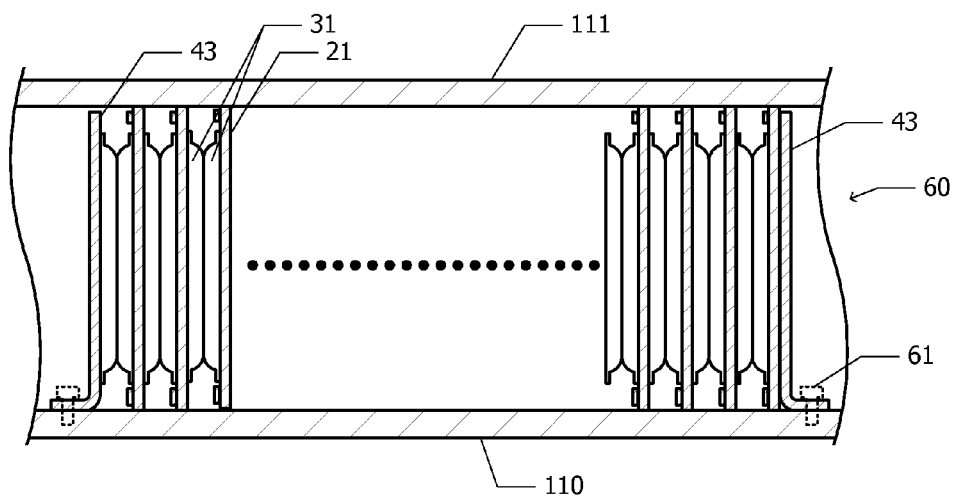

FIG. 9B is a cross-sectional view taken along one dot chain line 9B-9B of FIG. 9A. The power storage module 60 according to the embodiment 1 is fixed to the bottom surface of a lower housing 110 using screws 61. End surfaces of the heat transfer plates 21 contact to the bottom surface of the lower housing 110. An upper housing 111 is disposed on the power storage module 60. The upside end surfaces of the heat transfer plates 21 contact the upper housing 111. The heat transfer plates 21 transfer the heat generated in the storage cells 31 up to the lower housing 110 and the upper housing 111.

Figure 10A:
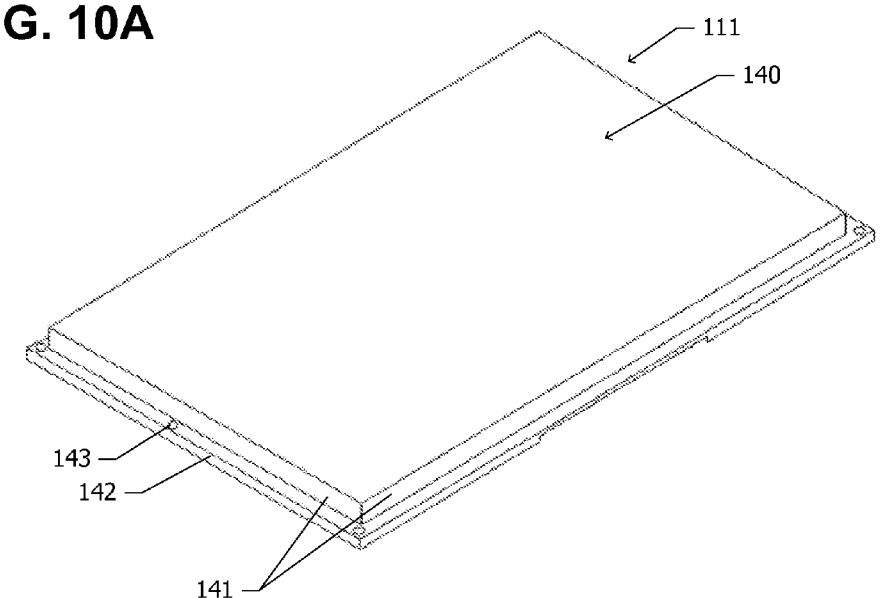
FIG. 10A is a perspective view of an upper housing and FIG. 10B is a perspective view of a lower housing.
Figure 10B:
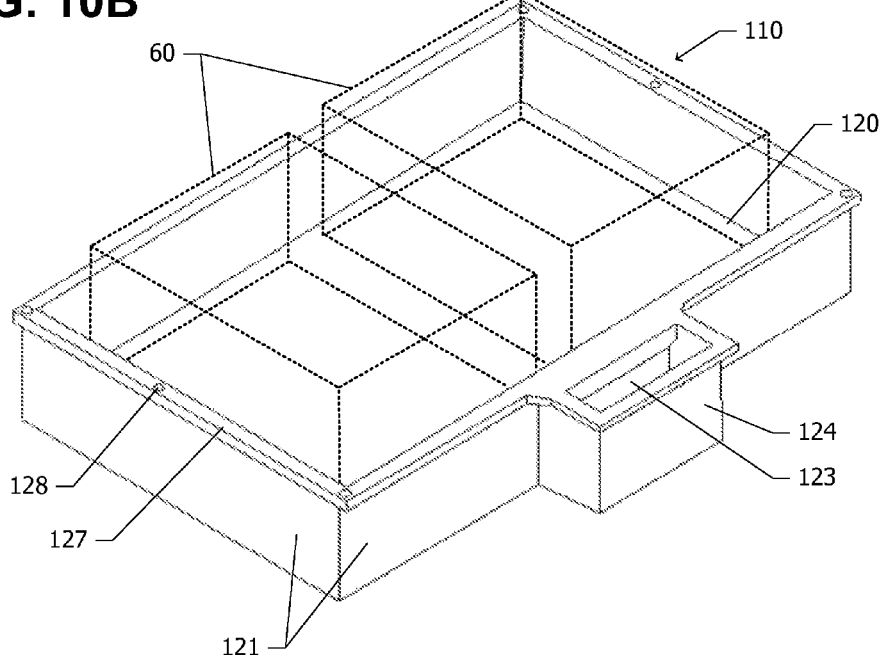

FIGS. 10A and 10B are perspective views of the upper housing 111 and the lower housing 110 in which the power storage module according to the embodiment 1 is accommodated, respectively.

As shown in FIG. 10B, the lower housing 110 includes a rectangular bottom panel 120, and four side panels 121 which extend upward from the edges of the bottom panel. The top of the lower housing 110 is opened. The opened portion of the lower housing 110 is covered by the upper housing 111 (FIG. 10A). Flanges 127 are provided on the upper ends of the side panels 121. A plurality of through-holes 128 for making bolts pass are formed on the flanges 127. For example, each of the lower housing 110 and the upper housing 111 is formed using casting.

Two power storage modules 60 (FIGS. 9A and 9B) are mounted on the bottom panel 120. The power storage modules 60 are screwed to the bottom panel 120 at the positions of the notches 47 (FIG. 9A). The power storage modules 60 are disposed with a posture in which the stacked directions are parallel to each other. An opening 123 is formed on one side panel 121 which crosses the stacked direction of each power storage module 60.

A connector box 124 is disposed on the outside of the side panel 121, on which the opening 123 is formed, so as to cover the opening 123. The top of the connector box 124 is opened. The opening is covered by connectors. The power storage modules 60 are connected to the outside electric circuit via the connectors. The two power storage modules 60 are connected to each other via fuses and a safety switch on the end portion opposite to the connector box 124.

The upper housing 111 includes an upper panel 140, and side panels 141 which extend downward from the edges of the upper panel 140. The outer circumference of the upper panel 140 matches the outer circumference of the bottom panel 120 of the lower housing 110. The height of the side panel 141 of the upper housing 111 is lower than the height of the side panel 121 of the lower housing 110. For example, the height of the side panel 141 is approximately 25% of the height of the side panel 121. Flanges 142 are provided on the lower ends of the side panels 141. A plurality of through-holes 143 are formed on the flanges 142. The through-holes 143 are disposed at positions corresponding to the through-holes 128 of the lower housing 110.

A flow channel for making a cooling medium flow is formed in the inner portions of the upper panel 140 of the upper housing 111 and the bottom panel 120 of the lower housing 110.

Bolts pass through the through-holes 128 of the lower housing 110 and the through-holes 143 of the upper housing 111 and are tightened by nuts, and thus, the upper housing 111 and the lower housing 110 sandwich the power storage modules 60 vertically. As shown in FIG. 9B, the heat transfer plates 21 are vertically sandwiched by the lower housing 110 and the upper housing 111, and thus, the power storage modules 60 are securely fixed to the housing so as not to be slidable. Moreover, the heat transfer efficiency between the heat transfer plates 21 and the lower housing 110 and the heat transfer efficiency between the heat transfer plates 21 and the upper housing 111 can be increased. The cooling medium which flows in the flow channel formed in the upper housing 111 and to the flow channel formed in the lower housing 110 cools the power storage cells 31 (FIG. 9B) via the heat transfer plates 21 (FIG. 9B).

Figure 11:
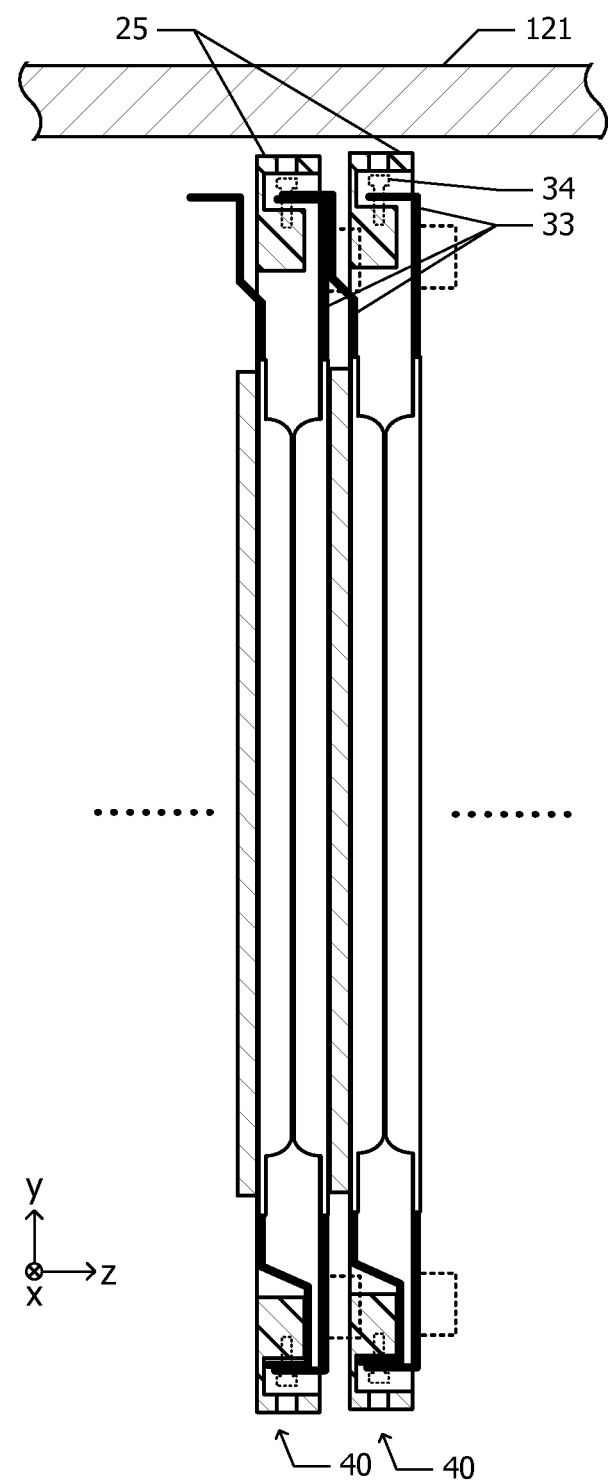
FIG. 11 is a cross-sectional view showing a positional relationship between the cell units which configure the power storage module and a side wall of the housing.

FIG. 11 shows a relative positional relationship between the cell units 40 which configure the power storage module 60 and the side panel 121 of the lower housing 110. The protective plates 25 are disposed between the conductive material and the side surface 121, the conductive material includes the electrode tabs 33 and the screws 34 for fixing the electrode tabs 33. Thereby, it is possible to prevent the electrode tabs 33 and the screws 34 from being in contact with and short-circuiting to the side panel 121.

Figure 12:
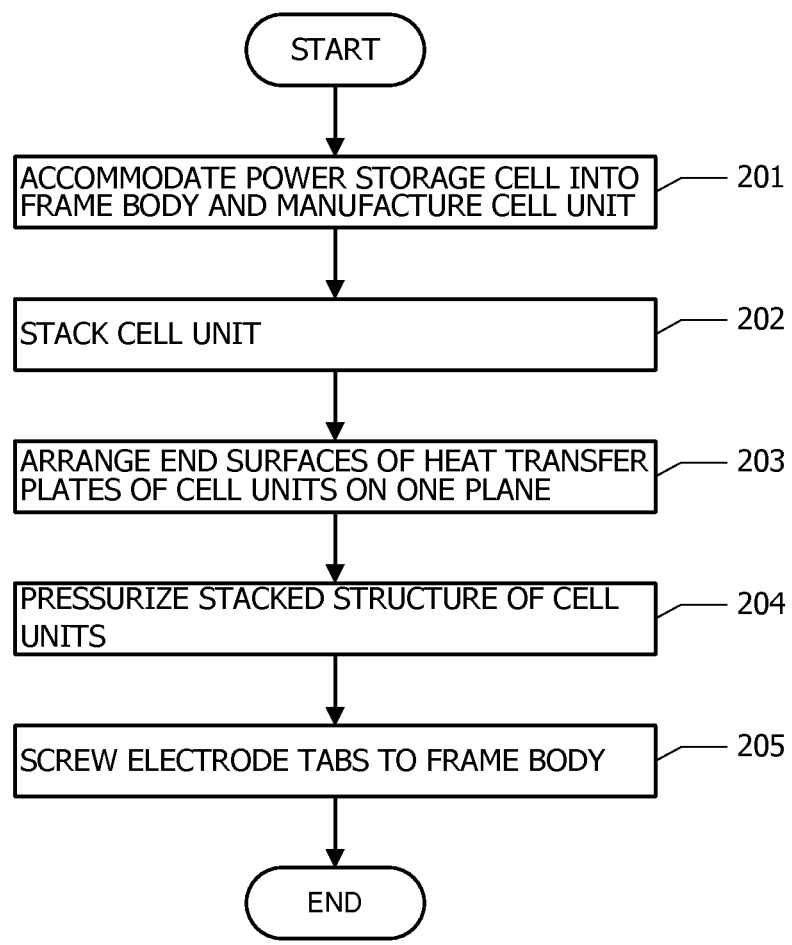
FIG. 12 is a flowchart showing a manufacturing method of the power storage module according to the embodiment 1.

FIG. 12 shows a flowchart of a manufacturing method of the power storage module 60 according to the embodiment 1. In step 201, power storage cells 31 (FIGS. 1A to 1C) are accommodated inside the frame body 20 (FIGS. 2 to 3B). Thereby, the cell unit 40 (FIGS. 4 to 6) is completed. At this time, as shown in FIG. 6, the electrode tabs 33 on the negative side in the y direction of the two power storage cells 31 are inserted into the interval between the x direction portion 20x and the protective plate 25, and are overlapped with each other. The electrode tab 33 on the positive side in the y direction of the power storage cell 31 of the bottom surface side is led up to the space on the bottom surface side of the frame body 20 through the opening portion 23. The electrode tab 33 on the positive side in the y direction of the power storage cell 31 of the upper surface side is inserted into the interval between the x direction portion 20x on the positive side in the y direction and the protective plate 25.

In step 202, the cell units 40 are stacked. Specifically, the convex portions 22 (FIGS. 8A and 8B) of the cell units 40 are inserted into the concave portions 29 (FIGS. 8A and 8B) of other cell units 40. At this time, as shown in FIG. 7, the electrode tab 33 on the positive side in the y direction of the power storage cell 31 of the bottom surface side of the cell unit 40 on the positive side in the z direction of two cell units 40 adjacent to each other is inserted into the interval between the x direction portion 20x of the cell unit 40 on the negative side in the z direction and the protective plate 25, and two electrode tabs 33 are overlapped with each other.

In the state where the cell units 40 are stacked, the pressurizing plates 43 (FIGS. 9A and 9B) are disposed on both ends of the stacked structure and are temporarily fixed by the tie-rods 44. In this step, the compressive force is not applied to the stacked structure.

In step 203, the end faces of the heat transfer plates 21 (FIG. 9B) of the stacked structure of the temporarily fixed cell units 40 are arranged on one plane. For example, as shown in FIG. 9B, the stacked structure is placed on the lower housing 110 in a posture that the edge which is bent in an L shape of the pressurizing plate 43 faces downward. In this step, since compressive force is not applied to the stacked structure, the cell units 40 are shifted within a range of a positioning margin of the positioning portion (convex portion 22 and concave portion 29) in the direction perpendicular to the stacked direction. The positioning portion has the positioning margin so that deviation of the relative position between the heat transfer plates 21 and the frame bodies 20 is absorbed, and thus, lower side end surfaces of the heat transfer plates 21 are arranged on one plane.

In step 204, the compressive force in the stacked direction is applied to the stacked structure of the cell units 40. Thereby, the relative position of the cell units 40 can be fixed in the state where the lower side end surfaces of the heat transfer plates 21 are arranged on one plane.

In step 205, electrode tabs 33 which are inserted between the x direction portions 20x and the protective plates 25 and overlapped with each other are fixed to the frame body 20 using screws 34 (FIG. 7). Thereby, the power storage cells 31 in the power storage module 60 (FIGS. 9A and 9B) are connected in series. Since tapped holes 24 (FIG. 7) are formed on the surface of the outer circumferential side of the frame body 20, the screws 34 can be tightened in the state where the cell units 40 are stacked.

In the manufacturing method according to the embodiment 1, at the time of the step for stacking the cell units 40, the electrode tabs 33 have not yet been connected between the cell units 40. Thereby, at the time of stacking the cell units 40, workers are free from complication that workers have to deform the connection portions of the electrode tabs 33 and perform the positioning of cell units 40 simultaneously.

In addition, in the method according to the embodiment 1, the electrode tabs 33 are screwed to the frame body after the compressive force is applied. If the compressive force is applied to the stacked structure of the cell units 40, the power storage cells 31 are deformed, and thus, the plurality of cell units 40 are relatively displaced in the z direction. Since the electrode tabs 33 are not fixed to the frame body 20 at this time, the electrode tabs 33 are not deformed. Thereby, it is possible to suppress stress generated at the connection portion between the electrode tab 33 and the positive electrode collector 51 and the connection portion between the electrode tab 33 and the negative electrode collector 52 shown in FIG. 1B.

[Embodiment 2]

Figure 13:
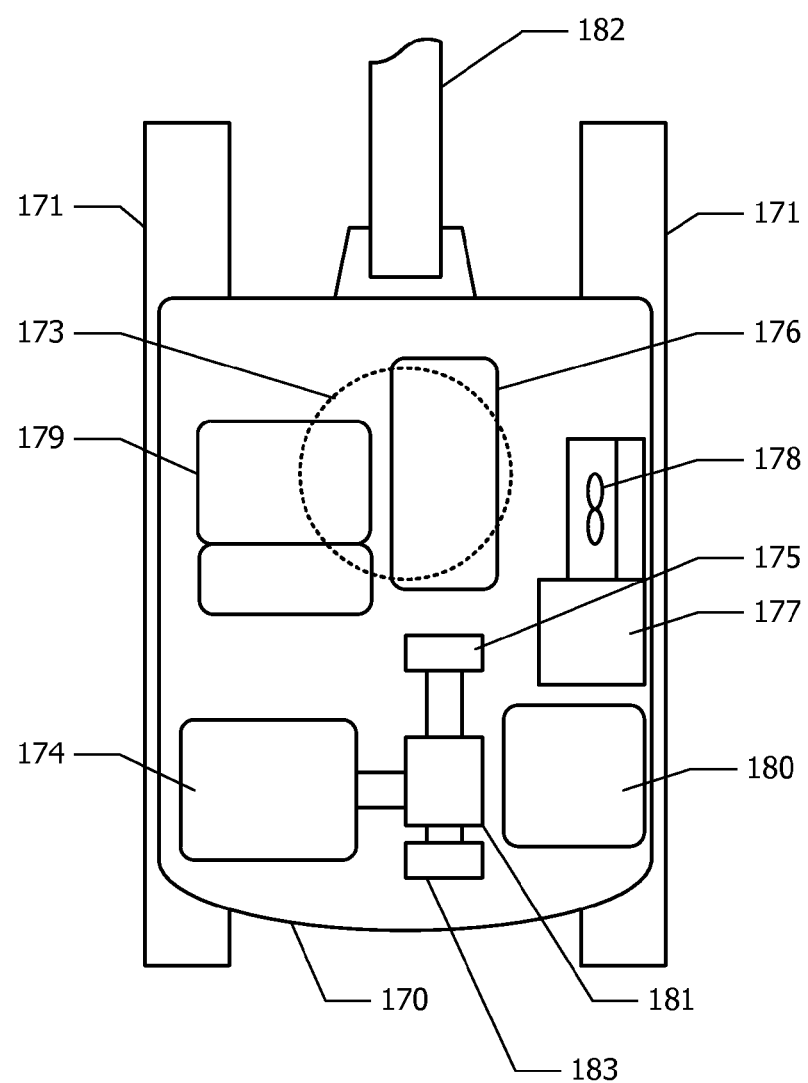
FIG. 13 is a schematic plan view of a working machine according to embodiment 2.

FIG. 13 is a schematic plan view of a shovel which is an example of a hybrid type working machine according to embodiment 2. A lower running device 171 is mounted to an upper rotating body 170 via a rotating bearing 173. An engine 174, a hydraulic pump 175, an electric motor (rotating motor; electric component) 176, an oil tank 177, a cooling fan 178, a seat 179, a power storage device 180, and a motor generator (electric component) 183 are mounted on the upper rotating body 170. The engine 174 generates motivity by combustion of a fuel. The engine 174, the hydraulic pump 175, and the motor generator 183 send and receive torque to one another via a torque transmission mechanism 181. The hydraulic pump 175 supplies pressure oil to hydraulic cylinders for a boom 182 and the like. The power storage device 180 includes the power storage module 60 (FIGS. 9A and 9B), the lower housing 110 (FIG. 10B), and the upper housing 111 (FIG. 10A) according to the embodiment 1.

The motor generator 183 is driven by the motivity of the engine 174 and generates electricity (power generation operation). The generated electric power is supplied to the power storage device 180 and the power storage device 180 is charged. Moreover, the motor generator 183 is driven by the electric power from the power storage device 180 and generates motivity for assisting the engine 174 (assist operation). The oil tank 177 stores oil of a hydraulic circuit. The cooling fan 178 suppresses the increase of the oil temperature of the hydraulic circuit. Operator sits on the seat 179 and operates the shovel.

A rotating motor 176 is driven by the electric power which is supplied from the power storage device 180. The rotating motor 176 rotates the upper rotating body 170. Moreover, the rotating motor 176 generates regenerative electric power by converting kinetic energy to electric energy. The power storage device 180 is charged by the generated regenerative electric power.

Figure 14:
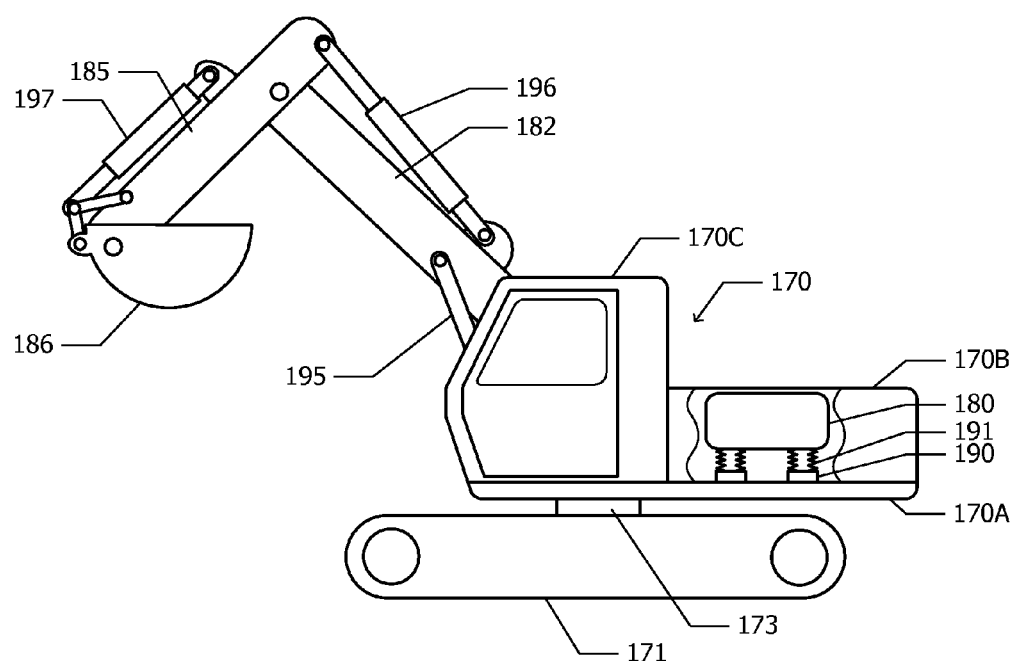
FIG. 14 is a partial breakaway side view of the working machine according to the embodiment 2.

FIG. 14 is a partial breakaway side view of the shovel according to the embodiment 2. The upper rotating body 170 is mounted on the lower running body 171 via the rotating bearing 173. The upper rotating body 170 includes a rotating frame 170A, a cover 170B, and a cabin 170C. The rotating frame 170A functions as a supporting structure of the cabin 170C and various parts. The cover 170B covers various parts which are mounted on the rotating frame 170A, for example, the power storage device 180, and the like. The seat 179 (FIG. 13) is accommodated in the cabin 170C.

The rotating motor 176 (FIG. 13) rotates the rotating frame 170A which an object to be driven with respect to the lower running body 171 in a clockwise direction or a counterclockwise direction. The boom 182 is mounted to the upper rotating body 170. The boom 182 swings vertically with respect to the upper rotating body 170 by a boom cylinder 195 which is hydraulically driven. An arm 185 is mounted on the tip of the boom 182. The arm 185 swings in front-back direction with respect to the boom 182 by an arm cylinder 196 which is hydraulically driven. A bucket 186 is mounted on the tip of the arm 185. The bucket 186 swings vertically with respect to the arm 185 by a bucket cylinder 197 which is hydraulically driven.

The power storage device 180 is mounted on the rotating frame 170A via a mount 190 for power storage device and a damper (vibration-proofing device) 191. For example, the power storage device 180 is disposed in the rear side of the cabin 170C. The cover 170B covers the power storage device 180.

During traveling or operating, the rotating frame 170A is largely vibrated compared to a general transportation vehicle. Thereby, the power storage device 180 which is mounted on the rotating frame 170A is susceptible to a large impact. Since the power storage module 60 according to the embodiment 1 is securely fixed into the lower housing 110 and the upper housing 111, impact resistance can be increased. In addition, since the power storage module according to the embodiment 1 is used for the power storage device 180, the complication of the stacking operation of the cell units 40 (FIG. 6) can be resolved.

It should be understood that the invention is not limited to the above-described embodiment, but may be modified into various forms on the basis of the spirit of the invention. Additionally, the modifications are included in the scope of the invention.

What is claimed is:

1. A power storage module comprising:
a plurality of cell units which are stacked; and
a pressurizing mechanism which applies a compressive force in a stacked direction to a stacked structure of the cell units,
wherein each of the cell units includes:
a power storage cell, which includes a pair of electrode tabs; and
a frame body which supports the power storage cell,
wherein the frame body includes a positioning portion and a screwing portion, the positioning portion restraining a relative position with respect to a direction perpendicular to the stacked direction of the frame bodies adjacent in the stacked direction, the screwing portion being formed on a surface of an outer circumference side of the frame body,
wherein the positioning portion includes a structure which positions the frame bodies with respect to the direction perpendicular to the stacked direction and leaves a margin in a direction in which the frame bodies are closer in the stacked direction in a state where the compressive force is applied to the stacked structure due to pressurization through the pressurizing mechanism, and
wherein the electrode tab of the power storage cell and the electrode tab of the adjacent power storage cell are laminated with each other and fixed to the frame body at the screwing portion.

2. The power storage module according to claim 1,
wherein the frame body has a shape which encloses the power storage cell when viewed with a visual line parallel to the stacked direction.

3. The power storage module according to claim 1,
wherein each of the cell units includes a heat transfer plate, and the heat transfer plate is fixed to the frame body and contacts the power storage cell in a state where the cell units are stacked.

4. The power storage module according to claim 3,
wherein the positioning portion allows shifting of the frame body in the direction perpendicular to the stacked direction so that end surfaces of the plurality of heat transfer plates are arranged on one plane before the cell units are pressurized by the pressurizing mechanism after being stacked.

5. The power storage module according to claim 1,
wherein
the electrode tab of the power storage cell and the electrode tab of the adjacent power storage cell are screwed to the screwing portion.

6. The power storage module according to claim 5,
wherein the screwing portion is disposed on a surface facing an outer circumferential side of the frame body in a state where the frame body is stacked in the stacked direction.

7. A working machine comprising:
a power storage module; and
an electric motor which is driven by electric power which is stored in the power storage module,
wherein the power storage module includes:
a plurality of cell units which are stacked; and
a pressurizing mechanism which applies a compressive force in a stacked direction to a stacked structure of the cell units,
each of the cell units includes:
a power storage cell, which includes a pair of electrode tabs; and
a frame body which supports the power storage cell,
wherein the frame body includes a positioning portion and a screwing portion, the positioning portion restraining a relative position with respect to a direction perpendicular to the stacked direction of the frame bodies adjacent in the stacked direction, the screwing portion being formed on a surface of an outer circumference side of the frame body,
wherein the positioning portion includes a structure which positions the frame bodies with respect to the direction perpendicular to the stacked direction and leaves a margin in a direction in which the frame bodies are closer in the stacked direction in a state where the compressive force is applied to the stacked structure due to pressurization through the pressurizing mechanism, and
wherein the electrode tab of the power storage cell and the electrode tab of the adjacent power storage cell are laminated with each other and fixed to the frame body at the screwing portion.

* * * * *